United States Patent [19]

Biesecker

[11] Patent Number: 5,070,916
[45] Date of Patent: Dec. 10, 1991

[54] APPARATUS FOR PROCESSING A MOLDED CARRIER RING DEVICE

[75] Inventor: Douglas A. Biesecker, Clarks Summit, Pa.

[73] Assignee: Universal Instruments Corporation, Binghamton, N.Y.

[21] Appl. No.: 536,293

[22] Filed: Jun. 11, 1990

[51] Int. Cl.⁵ ............................................. B21D 37/12
[52] U.S. Cl. ..................................... 140/105; 29/559; 29/827; 72/420; 72/465; 83/622
[58] Field of Search .................. 29/827, 559; 140/105; 72/465, 420, 330; 83/621, 622

[56] References Cited

U.S. PATENT DOCUMENTS

| | | | |
|---|---|---|---|
| 3,232,158 | 1/1966 | Breeding | 83/942 X |
| 4,352,309 | 10/1982 | Thalström et al. | 83/622 X |
| 4,945,954 | 8/1990 | Wehrly, Jr. | 140/105 |
| 4,957,146 | 9/1990 | Satterfield et al. | 140/105 |

FOREIGN PATENT DOCUMENTS

| | | | |
|---|---|---|---|
| 0101266 | 8/1979 | Japan | 140/105 |
| 1103928 | 7/1984 | U.S.S.R. | 140/105 |

Primary Examiner—Carl E. Hall
Attorney, Agent, or Firm—Fidelman & Wolffe

[57] ABSTRACT

An apparatus is provided for receiving a molded carrier ring package and removing the electronic component from the surrounding ring while cutting and forming the leads of the component. The shear provides that leads on two opposite sides of a rectangulopiped component are cut just prior to the leads extending from the remaining two sides, during one stroke of the shear, such that the applied force required to cut all of the leads is reduced by acting on one-half of the leads at a time, and such that the applied forces are balanced on opposite sides of the component. Each of a punch and die is easily interchanged with a replacement, and a scrap remover is continuously adjustable during closing of the jaws thereof, so that it is a simple matter to change the tooling and otherwise accommodate devices of different sizes. Also, the apparatus provides for diverting the forces of the shearing and forming action from a shuttle for transporting the device so as to minimize wear and tear on it.

3 Claims, 4 Drawing Sheets

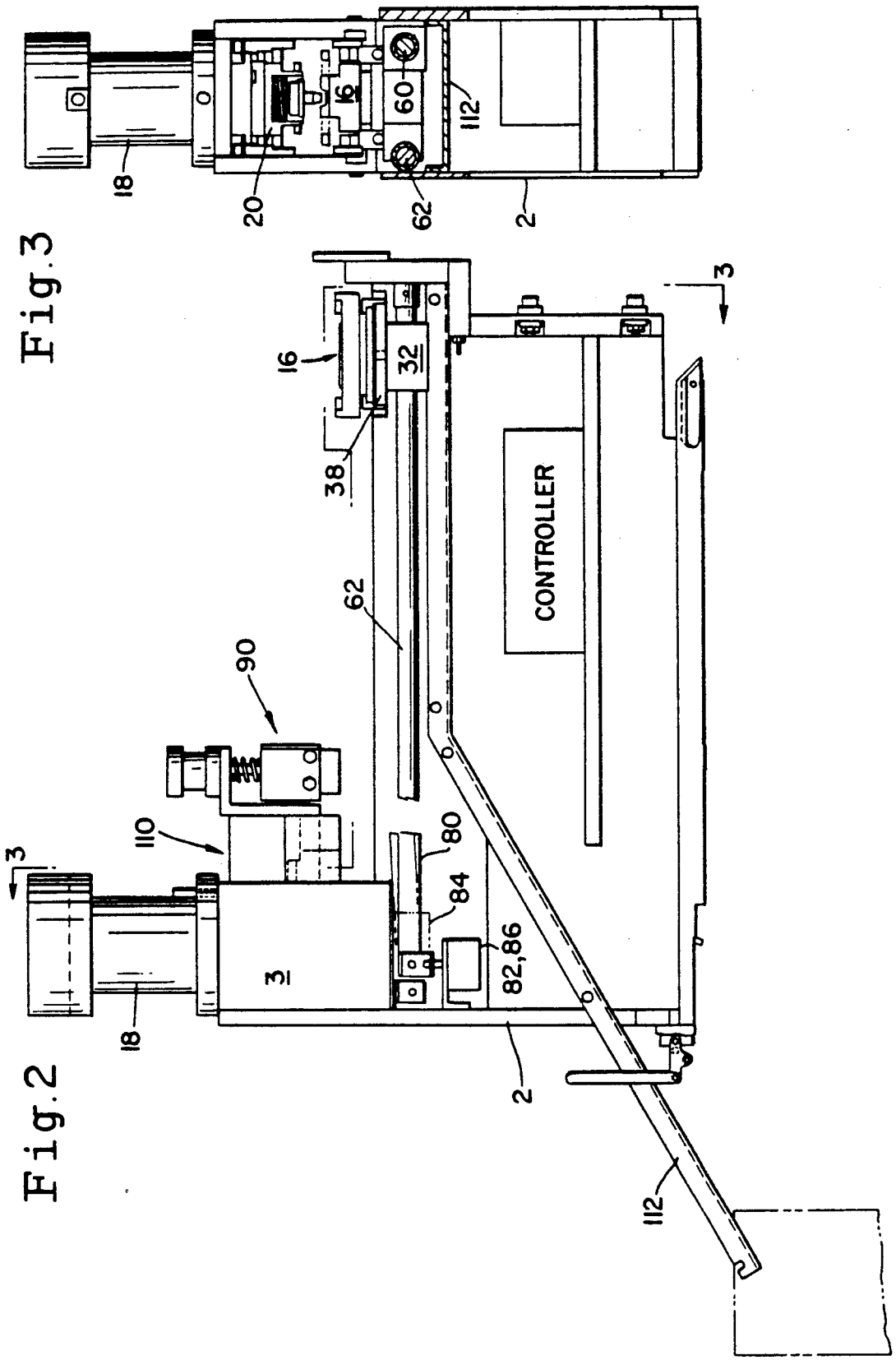

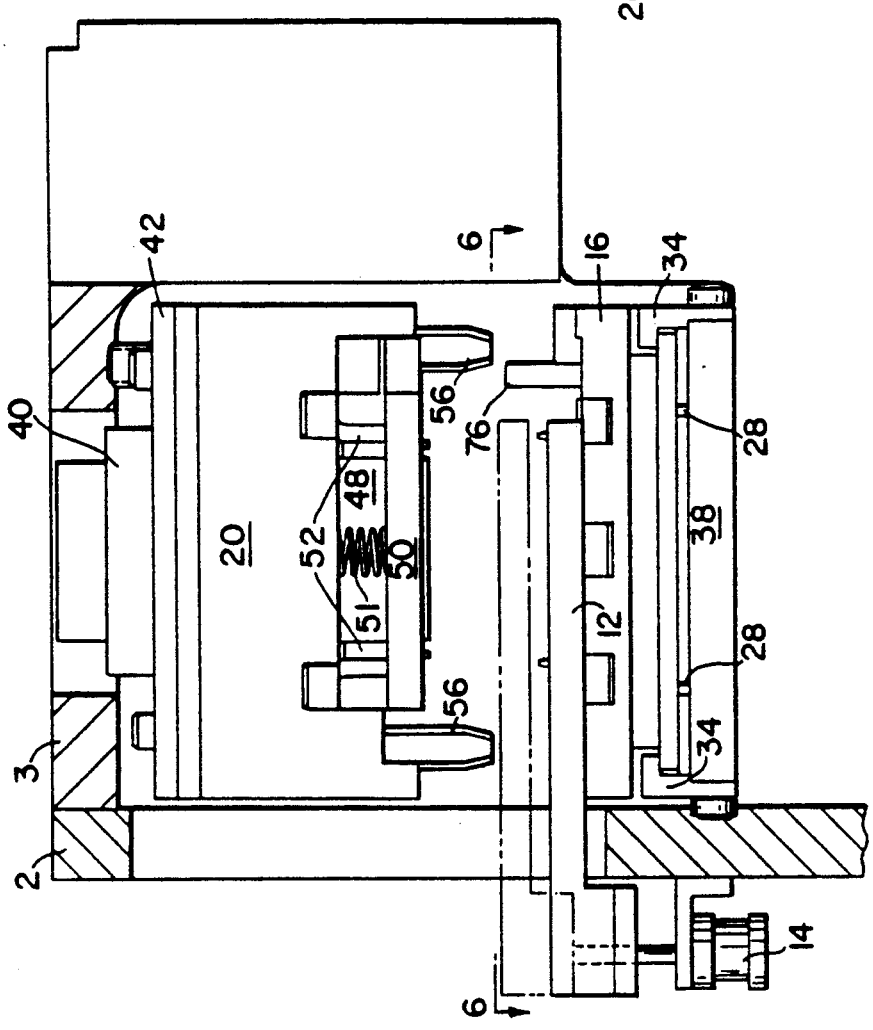

APPARATUS FOR PROCESSING A MOLDED CARRIER RING DEVICE

FIELD OF THE INVENTION

The invention deals with electronic packages comprising an electronic component and leads extending between the component and a surrounding molded ring for supporting and handling the component prior to mounting the component onto a circuit board. More particularly, the invention is directed to an apparatus for removing the component from the molded carrier ring while shearing and forming the leads for subsequent mounting on a circuit board.

An object of the invention is to provide a method and apparatus for minimizing the force required to accomplish the cutting and forming of all the leads of each component during a single stroke of the shear.

Also, it is an object of the invention to provide a unique structure for diverting the forces of the shearing and forming action from a shuttle for transporting the device.

Further, it is an object of the invention to provide a punch and a die, each of which is easily interchanged with a replacement, and a scrap remover which is continuously adjustable during closing of the jaws thereof, so that it is a simple matter to change the tooling and otherwise accommodate devices of different sizes.

SUMMARY OF THE INVENTION

An apparatus is provided for receiving a molded carrier ring package and removing the electronic component from the surrounding ring while cutting and forming the leads of the component. The shear provides that leads on two opposite sides of a rectangulopiped component are cut just prior to the leads extending from the remaining two sides, during one stroke of the shear, such that the applied force required to cut all of the leads is reduced by acting on one-half of the leads at a time, and such that the applied forces are balanced on opposite sides of the component. Each of a punch and die is easily interchanged with a replacement, and a scrap remover is continuously adjustable during closing of the jaws thereof, so that it is a simple matter to change the tooling and otherwise accommodate devices of different sizes. Also, the apparatus provides for diverting the forces of the shearing and forming action from a shuttle for transporting the device so as to minimize wear and tear on it.

BRIEF DESCRIPTION OF THE DRAWINGS

FIG. 2 is an elevational view of the apparatus, with a cover plate removed.

FIG. 3 is a cross-sectional, as generally viewed in the direction of arrows 3—3 of FIG. 2.

FIG. 4 is an enlargement of the cutting and forming station of FIG. 2, with parts broken away and with the die positioned therein.

FIG. 5 is a right side elevation of FIG. 4.

DETAILED DESCRIPTION OF THE INVENTION

Figure 1:
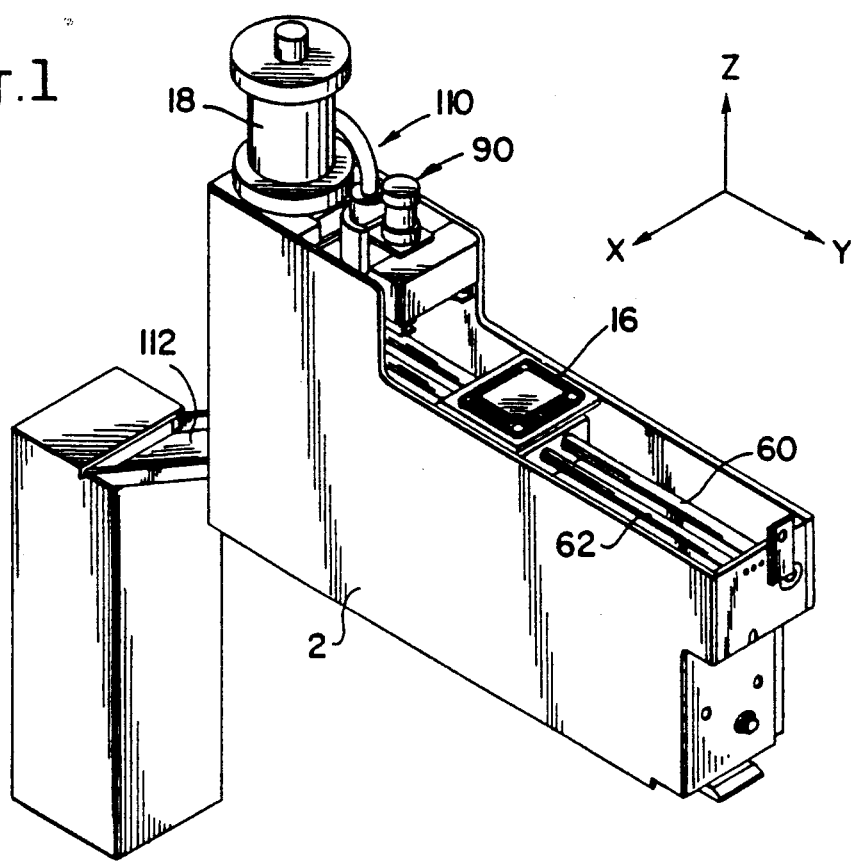
FIG. 1 is an isometric view of the apparatus of the invention.

Referring to FIGS. 1-3, hollow tube 60 extends the full length of a main frame 2 and, along with rod 62, guides and supports a shuttle 32 for movement back and forth therealong. As seen in FIG. 2, shuttle 32 is translatable between a "pick" station at the far right hand end of frame 2 and the "cut and form" station at the far left hand end thereof.

Figure 9:
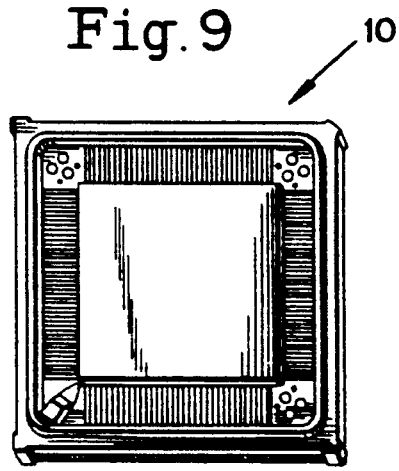
FIG. 9 is an isometric view of a molded carrier ring package.

Inside a housing 3 at the "cut and form" station is situated punch 20 which cooperates with die 16, carried by shuttle 32, to cut and form the leads 6 of a component 4 (FIG. 9) during removal of the component 4 from a molded carrier ring 8. A cylinder 18 vertically displaces punch 20, according to commands of a controller such as the printed circuit board central control of Universal Instruments Corporation, Binghamton, NY and having the part number UIC 43081701.

Referring to FIGS. 4 and 5, punch 20 is suspended from a punch holder 40, on the end of the piston rod of cylinder 18, by retainers 42. A spring-biased plunger 44 of holder 40 engages in detent 46 in punch 20, with there being tolerance (typically 0.020") for punch 20 to move in the X and Y directions (FIG. 2) relative to holder 40. The plunger and detent arrangement provides for repositioning of punch 20 in the X-Y plane and for detachment of punch 20 from holder 40 by overcoming the spring force on plunger 44 while sliding punch 20 in the Y direction. Thus, punch 20 is interchanged easily with one for punching devices of the same or different size as that illustrated.

Depending from and centrally located relative to the body of punch 20 is a pressure pad 48 which is biased to the extended position of FIGS. 4 and 5 by spring 49. Situated peripherally of pressure pad 48 are the inside former blades 54 and upper shear blades 52, respectively. A stripper ring 50 is movably attached to the body of punch 20 and biased to the position of FIGS. 4 and 5 by spring 51. Pressure pad 48 and stripper ring 50 respectively engage the component 4 and the molded carrier ring 8 generally simultaneously in order to insure full registration of the device 10 with die 16 during lowering of punch 20. Also depending from the body of punch 20 are locator rods 56 having tapered ends which enter corresponding holes 58 of die 16 (FIG. 6) in order to shift punch 20 in the X-Y plane and insure proper alignment of die 16 and punch 20 for the cut and form process.

Figure 6:
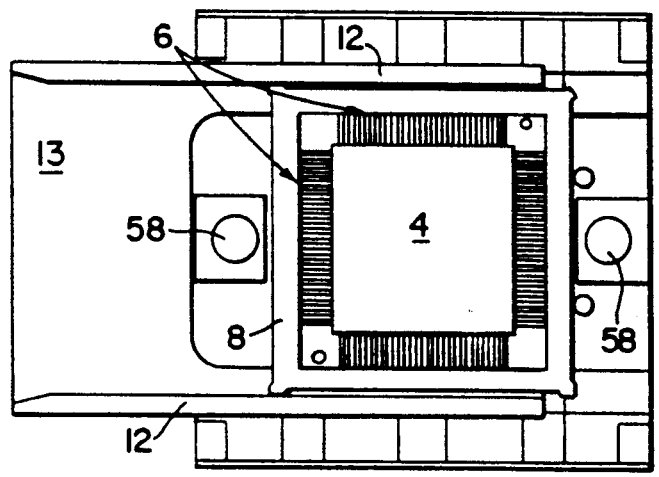
FIG. 6 is a cross-sectional as viewed generally in the direction of arrows 6—6 of FIG. 4.

As seen in FIGS. 4-6, die 16 has upwardly protruding outside formers 70 and lower shear blades 72 for cooperating, respectively, with inside formers 54 and upper shear blades 52 of punch 20 during processing of a device 10. Device locating pins 74 also protrude from die 16 in order to provide proper registration of the device 10 for the lead cutting and forming operation. As explained in the following, a pair of rods 76 also protrude from die 16 and are long enough to act as stops against which the device is fed during loading of the die 16.

Referring to FIGS. 4 and 5, die 16 is retained on die holder 38 by retainers 34. Prior to engagement of die 16 by punch 20, spring-biased plungers 28 of holder 38 maintain die 16 in a raised position, relative to a top surface of die holder 38, in engagement with die retainers 34. Plungers 28 ensure that a lower surface of die 16 is raised slightly clear of supports 26 when the shuttle 32 is positioned at the die loading and punching station and die 16 is not engaged by punch 20. Plungers 28 and die retainers 34 are provided in a structural arrangement which allows easy change of dies 16 in much the same manner as that for punches 20.

With shuttle 32 positioned at the die loading and punching station and with input rails 12 raised by extension of cylinder 14, a device 10 is delivered to tray 13 and along rails 12 and into engagement with horizontal feed stops 76 of die 16. Thereafter, rails 12 are lowered so as to lower the device 10 onto die 16, and cylinder 18 is actuated to drive punch 20 downwardly.

During downward travel of punch 20, vertical posts 22 of punch 20 engage flats 24 of die 16 and drive die 16 down into engagement with L-shaped die supports 26 mount on housing 3. Thus, during the punching and forming operation, supports 26 bear the forces that otherwise would be transmitted to shuttle 32 and its supporting members 60 and 62.

The shearing blades are particularly adapted to minimize the force required, and thus the cost, of cylinder 18 by providing that the leads protruding from two oppositely disposed sides of the device 10 are sheared prior to shearing the leads protruding from the other sides of the device. It was found that simultaneous shearing of leads disposed on opposite sides of the device 10 provided a balanced mechanism that did not introduce unnecessary, unbalancing torque on the mechanism.

With cutting and forming of leads 6, component 4 is physically separated from the carrier ring 8 and, during raising of punch 20 clear of die 16, spring biased pressure pad 48 and spring biased stripper ring 50 insure that the liberated component 4 and the "scrap" molded carrier ring 8 remain on die 16 for subsequent transfer from the cut and form station.

Thereafter, shuttle 32 is translated to the "pick" station for removal of component 4 from die 16. After removal oft he component from die 16, shuttle 32 is translated back toward the cut and form station (which is also the die loading station). In route, shuttle 32 is stopped at a "scrap" removal station 90 by engaging a stop 80 which has been raised to an interfering position by cylinder 82.

Figure 8:
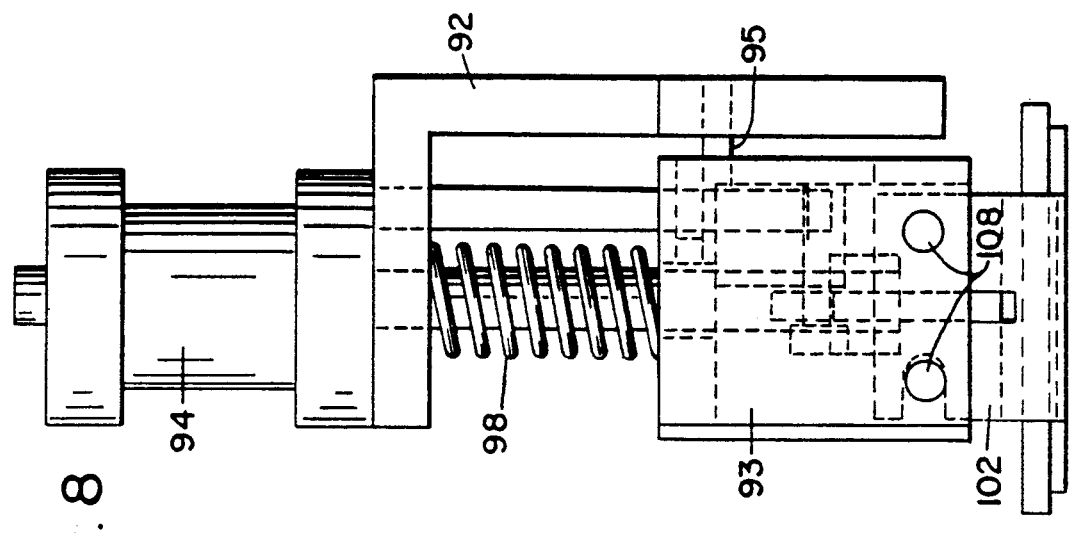
FIG. 8 is a right side elevation of FIG. 7.
Figure 7:
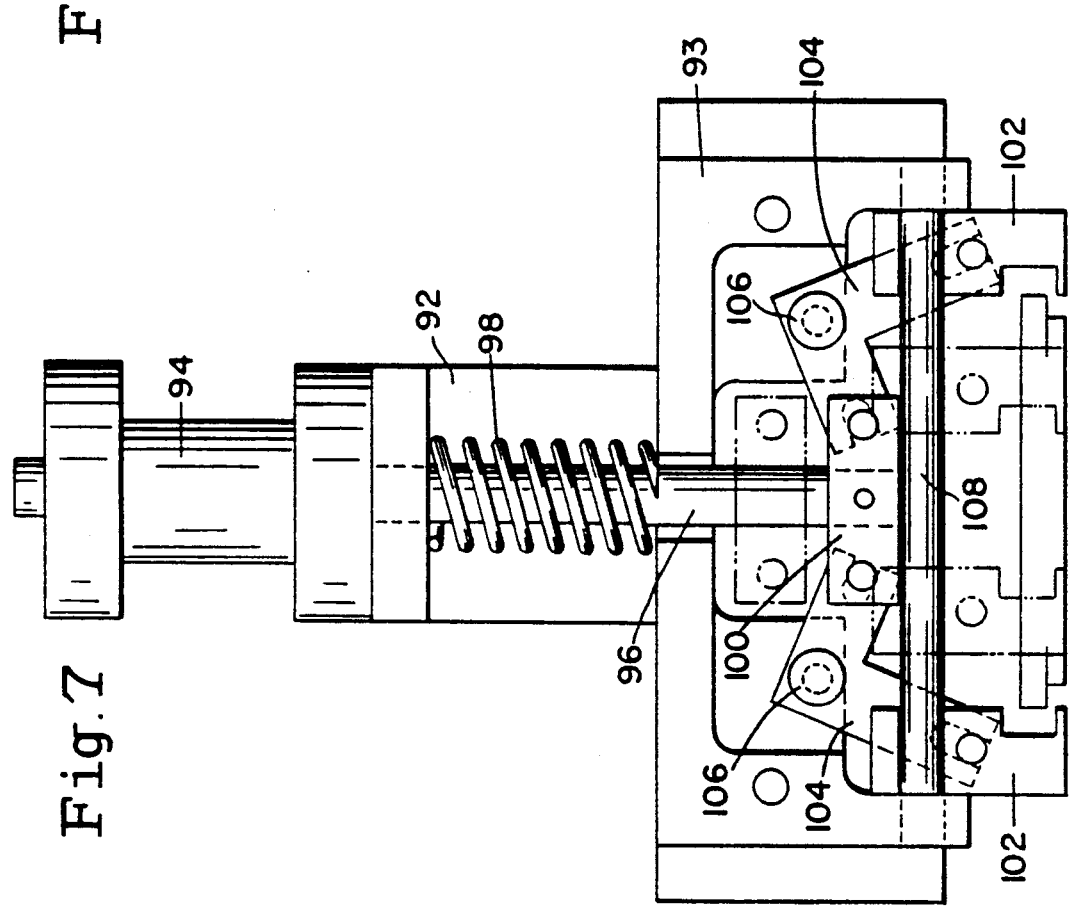
FIG. 7 is an elevational view of the scrap remover.

At station 90, a pair of jaws 102 are used to grasp the molded carrier ring 8 and remove it from die 16. Jaws 102 are slidable along guide rods 108 so as to open and close in a manner by which they can grip rings 8 of varying sizes. As seen in FIGS. 7 and 8, an L-shaped bracket 92 supports actuating cylinder 94. Jaw frame 93 is displaceable upwardly along a rod 97 by retraction of piston rod 96. Rod 97 protrudes down from bracket 92 and prevents rotation of frame 93 about rod 96. Spring 98 biases frame 93 down to the position of FIG. 7. In operation, frame 93 initially is in the position of FIG. 7 with jaws 102 spread so as to clear a device 10 being carried on shuttle 32. When shuttle 32 is stopped at the "scrap" removal station, cylinder 94 is fired to raise portion 100 thereof and thus cause L-shaped links 104 to pivot about pins 106 which are mounted on frame 93. This action causes jaws 102 to slide along rods los and close on the empty carrier ring 8. When the rod 96 is retracted sufficiently to overcome the force of spring 98, then the frame 93 is raised so as to lift the carrier ring 8 from die 16.

Next, shuttle 32 is retracted slightly away from stop 80 to allow the stop to be lowered out of the way, and then shuttle 32 is advanced further (to the left in FIG. 2) and into engagement with another stop 84 which has been raised into position by cylinder 86. In this position of shuttle 32, die 16 is situated under a vacuum cleaning assembly 110 which is energized so as to evacuate all metallic and plastic particles from the die 16. Thereafter, shuttle 32 again is backed away to clear stop 84 and allow retraction of same out of the feed path, whereupon shuttle is advanced to the die loading station.

At a convenient time after shuttle 32 has cleared "scrap" removal station 90, jaws 102 are opened to drop the scrap carrier ring 8 onto scrap chute 112.

In the preferred embodiment, the shuttle 32 is driven back and forth by a so-called "rodless cylinder" which comprises hollow tube 60 having an outer collar and an inner core, with the collar and core magnetically coupled and moveable along the length of the tube 60 by variation of magnetic flux. Such a rodless cylinder is manufactured by S.M.C. Pneumatics, Inc., Indianapolis, IN, as part number NYC 1B10.

The following claims are intended to cover all of the generic and specific features of the invention herein described and all statements of the scope of the invention which as a matter of language, might be said to fall therebetween.

Now that the invention has been described, I claim:

1. An apparatus for processing devices having components which are attached by leads of the components to a means for carrying said components, said apparatus comprising:

means for transporting each said device to a processing station in preparation for a processing operation at said station;

means for applying forces to said device at said station in order to accomplish said processing operation;

means, at said station, for supporting a device-supporting portion of said transporting means separately from a remainder of said transporting means during said applying of forces such that transmission of said forces to said remainder of said transporting means is prevented.

2. An apparatus as in claim 1, wherein:

said transporting means comprises a shuttle and a generally inflexible pad which is spring biased upwardly a particular distance from a top surface of said shuttle and into engagement with retainers of said shuttle;

said device being supported upon said pad such that said forces are transmitted to said pad during said processing; and said supporting means being force isolated from said transporting means and engaging and halting downward movement of said pad during application of said forces and prior to said pad being depressed into engagement with said top surface.

3. An apparatus for processing devices having components which are attached by leads of the components to a means for carrying said components, said apparatus comprising:

means for transporting each said device to a processing station in preparation for a processing operation at said station, and comprising a shuttle and a generally inflexible pad which is spring biased upwardly a particular distance from a top surface of said shuttle and into engagement with retainers of said shuttle, said pad supporting said device such that forces are transmitted to said pad during said processing;

means for applying forces to said device at said station in order to accomplish said processing operation;

means for supporting said device at said station during said applying of forces such that transmission of said forces to said transporting means is prevented, said supporting means being force isolated from said transporting means and engaging and halting downward movement of said pad during application of said forces and prior to said pad being depressed into engagement with said top surface.

* * * * *